United States Patent
Murakami

(10) Patent No.: US 7,977,019 B2
(45) Date of Patent: Jul. 12, 2011

(54) SEMICONDUCTOR DEVICE MANUFACTURING METHOD, SEMICONDUCTOR DEVICE MANUFACTURING EQUIPMENT, AND COMPUTER READABLE MEDIUM

(75) Inventor: Takashi Murakami, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 290 days.

(21) Appl. No.: 12/379,166

(22) Filed: Feb. 13, 2009

(65) Prior Publication Data

US 2009/0214964 A1 Aug. 27, 2009

(30) Foreign Application Priority Data

Feb. 22, 2008 (JP) ................. 2008-042015

(51) Int. Cl.
*G03F 9/00* (2006.01)
*G03C 5/00* (2006.01)
(52) U.S. Cl. .......... 430/30; 430/312; 430/313; 430/314; 430/316; 430/323; 430/328; 430/329; 430/330
(58) Field of Classification Search .................... 430/30, 430/312, 313, 314, 316, 323, 328, 329, 330
See application file for complete search history.

(56) References Cited

U.S. PATENT DOCUMENTS

2009/0008381 A1  1/2009  Jyousaka et al.

FOREIGN PATENT DOCUMENTS

| JP | 2006-228816 | 8/2006 |
|---|---|---|
| JP | 2006-237260 | 9/2006 |
| JP | 2007-35777 | 2/2007 |
| JP | 2007-110080 | 4/2007 |
| WO | WO 2007/032370 A1 | 3/2007 |

OTHER PUBLICATIONS

"Across-wafer CD Uniformity Control Through Lithography and Etch Process: Experimental Verification" Qiaolin (Charlie) Zhang, et al., SPIE vol. 6518 65182C-1,2007.

*Primary Examiner* — Christopher G Young
(74) *Attorney, Agent, or Firm* — McGinn IP Law Group, PLLC

(57) ABSTRACT

A semiconductor device manufacturing method, a semiconductor device manufacturing equipment and a computer readable medium storing a computer program provide for easily identifying a cause of a deviation of pattern dimensions from the objective dimension.

A first storage section stores a relation between a PEB temperature and a photoresist dimension of a post-lithography. A second storage section stores a relation between a PEB temperature and a post-etching dimension. A primary correction section determines a first corrected PEB temperature for conforming the photoresist dimension of a post-lithography to the objective dimension, using the relation data stored in the first storage section. A secondary correction section determines the second corrected PEB temperature for conforming the post-etching dimension using the first corrected PEB temperature to the objective dimension, using the relation data stored in the second storage section.

8 Claims, 4 Drawing Sheets

SEMICONDUCTOR DEVICE MANUFACTURING METHOD, SEMICONDUCTOR DEVICE MANUFACTURING EQUIPMENT, AND COMPUTER READABLE MEDIUM

BACKGROUND OF THE INVENTION

1. Field of the Invention

The present invention relates to a semiconductor device manufacturing method, a semiconductor device manufacturing equipment and a computer readable medium for performing the semiconductor device manufacturing method.

2. Description of the Related Art

Patterns for semiconductor devices are lately becoming finer in size. Chemical amplification resist is used to form a pattern for a semiconductor device. The precision required of resist pattern dimensions is increasing as patterns for semiconductor devices become finer in size. However, various factors cause the dimensions of an actually formed pattern to deviate from its objective dimensions. Factors for the deviation from the objective dimensions include ones originating from machines such as a coater/developer, an exposure unit, and an etcher, and ones originating from processes. The amount of deviation from the objective dimensions may vary even within the same substrate plane depending on the location. Fluctuations in dimensions within the same substrate plane cause individual differences in electric characteristics and other characteristics of the semiconductor device, and can lead to an increased ratio of defective products.

Controlling the temperature in a post-exposure bake (PEB) step is a known way to control the pattern dimensions. The PEB step is a process of heating resist after exposure, and is conducted in order to accelerate the chemical reaction of the resist.

Technologies of controlling the temperature in the PEB step are disclosed in, for example, JP 2006-228816A (hereinafter referred to as Patent Document 1), JP 2006-237260 A (Patent Document 2), JP 2007-110080 A (Patent Document 3), and an article titled "Across-wafer CD Uniformity Control Through Lithography and Etch Process: Experimental Verification" published in Proceedings of SPIE Vol. 6518 65182 C (Non-Patent Document 1).

JP 2007-35777 A (Patent Document 4) describes a semiconductor device manufacturing method that includes an etching condition setting step, a correlation obtaining step, and a feedback processing step in addition to performing a lithography treatment and an etching treatment on a plurality of semiconductor wafers of each of a plurality of lots. In the correlation obtaining step, obtaining a log of an etcher used in the etching treatment and measuring the etching dimensions are executed in order for each semiconductor wafer. In a relational expression creating step, a parameter is chosen from the etcher log to create, for each chosen parameter, a relational expression that represents the correlation between the parameter and etching dimensions. In the feedback processing step, a parameter obtained for each semiconductor wafer is substituted into the above-mentioned relational expression to calculate etching dimensions, and lithography conditions are set for each semiconductor wafer separately based on the thus calculated predicted values.

The following analyses are given by the present invention.

In a semiconductor device manufacturing process, manufacture conditions have to be reviewed if the dimensions of an actually formed pattern deviate from its objective dimensions. It is important in reviewing manufacture conditions to identify which step has caused the occurring deviation from the objective dimensions. However, as mentioned above, various factors can contribute to the deviation of the dimensions of a pattern formed after etching, and identifying the cause of the deviation is difficult.

SUMMARY

According to the present invention, a semiconductor device manufacturing method includes the followings: a first substrate heating step (S12), a primary correction step (S15), a second substrate heating step (S22), and a secondary correction step (S26).

In the first substrate heating step (S12), a plurality of heat treatment plates heat separately a plurality of first substrates. Each of the plurality of first substrates has, on its surface, a layer of first resist formed by exposure in a predetermined pattern.

After the first substrate heating step (S12), the primary correction step (S15) performs the primary correction of a preset temperature for each of the plurality of heat treatment plates.

In the second substrate heating step (S22), the plurality of heat treatment plates heat separately a plurality of second substrates at a preset temperature corrected by the primary correction. Each of the plurality of second substrates has a layer of second resist formed by exposure in the predetermined pattern on a surface of a layer of resist having the same composition as a composition of the first resist.

After the second substrate heating step (S22), the secondary correction step (S26) performs a secondary correction of the preset temperature for each of the plurality of heat treatment plates.

Further, the primary correction step (S15) is executed based on measured dimensions of a pattern of the first resist which is obtained by developing each of the plurality of first substrates after the first substrate heating step (S12).

In addition, the secondary correction step (S26) is executed based on measured dimensions of an etching pattern which is obtained by developing and etching each of the plurality of second substrates after the second substrate heating step (S22).

According to another aspect of the present invention, a semiconductor device manufacturing equipment includes: a plurality of heat treatment plates (31a, 31b and 31c) for a post-exposure bake (PEB) step; a first storage section (13) for storing a first relation, which is an association relation between post-development resist pattern dimensions and a preset temperature in the PEB Step (a PEB temperature); a second storage section (14) for storing a second relation between post-etching pattern dimensions of a film being processed and a preset temperature in the PEB step (a PEB temperature); a primary correction section (11) for obtaining post-development resist pattern dimension data for each of a plurality of first substrates processed separately by the plurality of heat treatment plates, and for primarily correcting the preset temperature for each of the plurality of heat treatment plates based on the first relation; and a secondary correction section (12) for obtaining post-etching pattern dimension data of the film being processed for each of a plurality of second substrates processed separately by the plurality of heat treatment plates (31a, 31b and 31c) at the preset temperature corrected by the primary correction, and for secondarily correcting the preset temperature for each of the plurality of heat treatment plates based on the second relation.

According to another aspect of the present invention, a computer readable medium storing a program executed by a computer for operating as the above-mentioned semiconductor device manufacturing equipment is provided.

According to the present invention, the deviation of the post-development resist pattern dimension from the predetermined pattern dimension which is caused by the lithography step and preceding treatments, is corrected through the primary correction step (S15). The secondary correction step (S26) corrects the deviation of the post-etching dimensions from the predetermined pattern dimension which is caused by the etching step. Since the deviation caused by the lithography step and preceding treatments is already corrected in the secondary correction step (S26), how much deviation from the predetermined dimension is caused by the etching step can be easily identified.

Furthermore the first substrates can be used as the second substrates if the resist is peeled from the substrates, because no etching treatments are applied to the first substrates. Therefore performing the primary correction does not waste substrates.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

A manufacturing equipment for a semiconductor device according to a first embodiment of the present invention will be described with reference to the attached drawings.

First Embodiment

Figure 1:
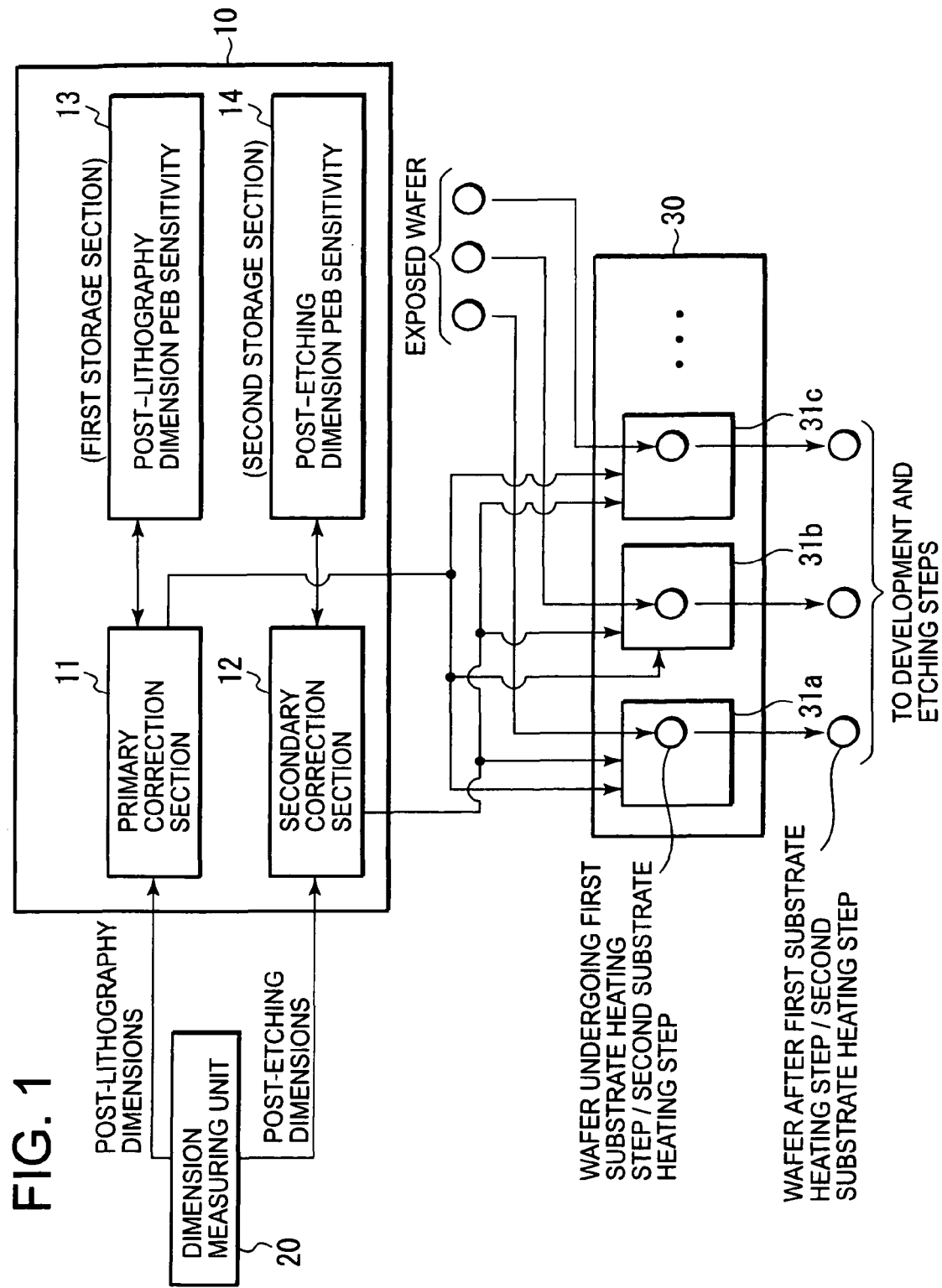
FIG. 1 is a schematic structural diagram illustrating a semiconductor device manufacturing equipment according to a first embodiment of the present invention.

A first embodiment of the present invention will be described with reference to the drawings. FIG. 1 is a schematic structural diagram illustrating a semiconductor device manufacturing equipment according to this embodiment. The semiconductor device manufacturing equipment has a heat treatment unit 30, a control unit 10, which controls the temperature of the heat treatment unit 30, and a dimension measuring unit 20, which measures the dimensions of a pattern.

A substrate processed by the semiconductor device manufacturing equipment of this embodiment is a semiconductor wafer with a film being processed formed on its principal surface. First, a layer of chemical amplification resist is formed on the film being processed of the semiconductor wafer. The resist is exposed to light in a predetermined pattern. The exposed wafer receives heat treatment for accelerating the chemical reaction of the resist (PEB). A development treatment is then performed on the semiconductor wafer to pattern the resist. The remaining resist is used as a mask for etching the film. After the etching, the resist is peeled off. The film with the predetermined pattern is obtained.

Figure 2:
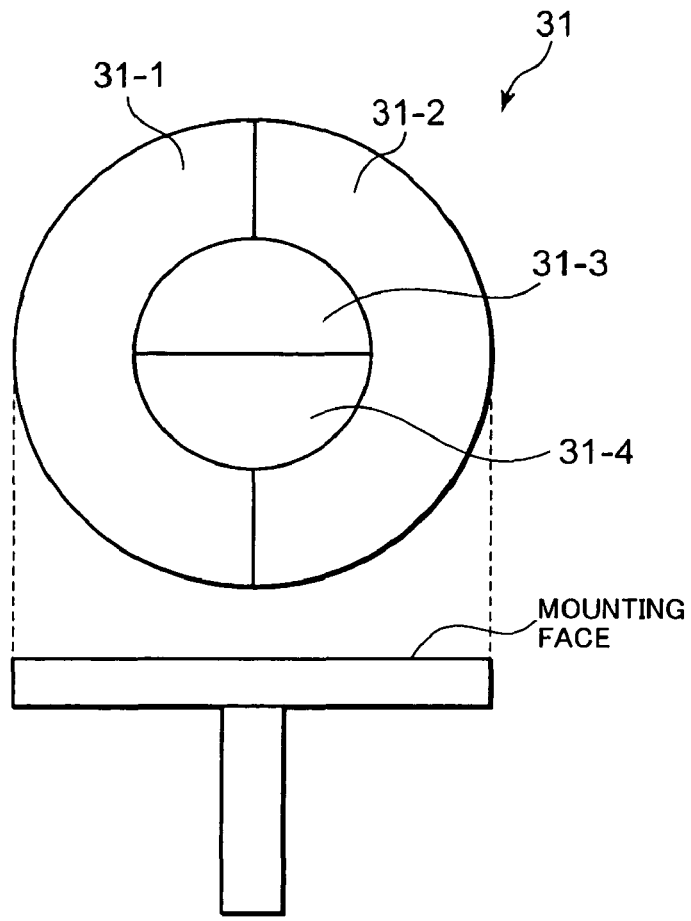
FIG. 2 is a schematic diagram of a heat treatment plate.

The heat treatment unit 30 is used in the above-mentioned PEB treatment. This heat treatment unit 30 includes a plurality of heat treatment plates (31a, 31b, 31c . . . , for manufacturing semiconductor devices in mass). FIG. 2 is a schematic diagram illustrating how each of the plurality of heat treatment plates 31 (31a, 31b, 31c . . . ) looks. As illustrated in FIG. 2, each heat treatment plate 31 includes a mounting face on which a single semiconductor wafer is placed, and the mounting face is divided into a plurality of heating regions (31-1, 31-2, 31-3, and 31-4). The plurality of heating regions 31 are heated by separate heaters in order to control the temperature of the plurality of heating regions 31 independently of one another. FIG. 2 illustrates an example in which one heating plate 31 is divided into four heating regions, but the number and shape of heating regions created by the division are not limited to this example. By thus dividing the mounting face of each heat treatment plate 31 into the plurality of heating regions 31 which are controlled in temperature independently of one another, fluctuations in pattern dimensions within a semiconductor wafer plane are controlled.

The dimension measuring unit 20 is for measuring the dimensions of a pattern formed on a semiconductor wafer. All kinds of dimension-measuring machines, including length-measuring scanning electron microscopes (SEMs), optical critical dimension (OCD) measuring units, and scatterometers, can be employed as the dimension measuring unit 20. The dimension measuring unit 20 measures the dimensions of a resist pattern after development (hereinafter referred to as post-lithography dimensions). The dimension measuring unit 20 also measures the dimensions of the processed film after etching (hereinafter referred to as post-etching dimensions). Measurements provided by the dimension measuring unit 20 are notified to the control unit 10. The dimension measuring unit 20 may be structured such that the control unit 10 is automatically notified of measured dimension data.

The control unit 10 controls the preset temperature of the heat treatment unit 30 in order to form a pattern on a semiconductor wafer to desired dimensions.

The use of chemical amplification resist in a lithography step has become essential as the miniaturization of patterns for semiconductor devices advances. Chemical amplification resist contains a photo-acid generating agent, which generates acid when exposed to light, and enhances the solubility of a developing solution in an exposed part through a chemical reaction where the generated acid acts as a catalyst. The PEB treatment is a treatment for accelerating the chemical reaction by heating after exposure, and holds a great weight in controlling a resist pattern. The PEB treatment is usually performed within a temperature range of about 80° C. to 150° C. The PEB temperature determines how far the acid generated by the photo-acid generating agent is diffused. Accordingly, the PEB temperature varies the area where the chemical reaction is accelerated and varies the dimensions of the resist pattern after development. In the case of annealing-type chemical amplification resist, for example, shifting the PEB temperature by only 1° C. changes the dimensions of the resist pattern after development by several nanometers. Controlling the preset temperature of the heat treatment unit 30 thus controls the acid diffusion length of chemical amplification resist and ultimately controls the dimensions of the resist pattern after development.

The resist pattern dimensions could be controlled by controlling exposure conditions (e.g., exposure amount and exposure time) during exposure. However, changing exposure conditions sometimes invites an unintended change in sectional shape of the resist pattern after development. Specifically, changing exposure conditions changes the tilt of the side walls in section of the resist pattern, with the result that the intended post-etching dimensions are not obtained through an etching treatment that uses the resist pattern as a mask. Dimension control by way of exposure conditions also requires individual control for each reticle and shot size. In contrast, controlling the resist pattern dimensions by way of PEB temperature as in this embodiment does not cause a significant change in sectional shape and does not require individual control for each reticle and shot size.

The control unit 10 includes a primary correction section 11, a secondary correction section 12, a first storage section 13, and a second storage section 14. The control unit 10 is, for example, a computer, and functions of the control unit 10 are implemented by a CPU by running a program (semiconductor device manufacturing program) that is installed in a memory. With a computer, the preset temperature of the heat treatment unit 30 can be controlled precisely.

Figure 3:
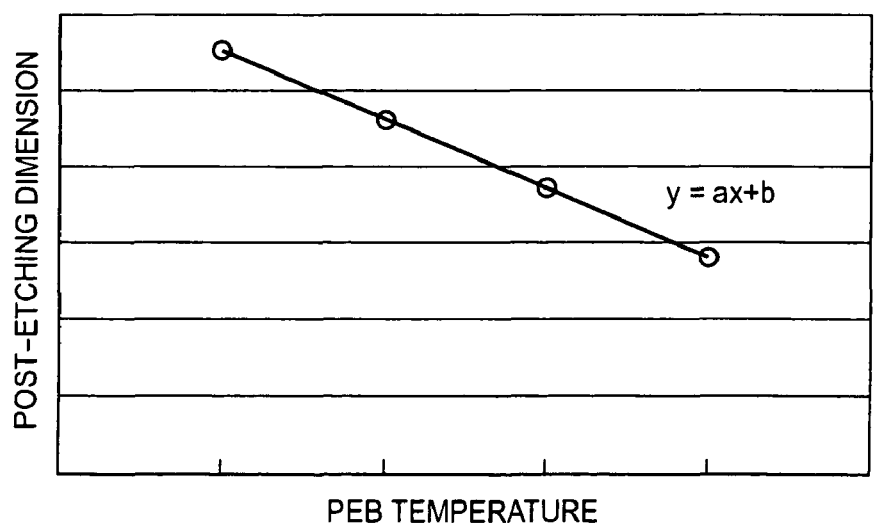
FIG. 3 is a conceptual diagram of a second relation.

The second storage section 14 stores in advance a post-etching dimension PEB sensitivity. Specifically, the second storage section 14 stores the association relation between the temperature in the PEB treatment and the post-etching dimensions (hereinafter referred to as second relation) as illustrated in FIG. 3. In FIG. 3 where the abscissa axis (x axis) represents the PEB temperature and the ordinate axis (y axis) represents the post-etching dimensions, the post-etching dimensions decrease linearly as the temperature in the PEB treatment (PEB temperature) becomes higher. The PEB temperature and the post-etching dimensions thus have a relation expressed as $y=ax+b$. A lithography dimension PEB sensitivity is expressed by the amount of change in post-etching dimensions per a unit degree of the PEB temperature, in other words, expressed by the coefficient a. The PEB temperature is, for example, a temperature measured by a temperature sensor that is installed for each heater embedded in the heat treatment plate.

The first storage section 13 stores in advance a post-lithography dimension PEB sensitivity. Specifically, the first storage section 13 stores the association relation between the PEB temperature and the post-lithography dimensions (hereinafter referred to as first relation). The first relation is similar to the second relation in that raising the PEB temperature tends to linearly decrease the post-lithography dimensions. The graph of the first relation is omitted because the graph of the first relation behaves in the same way as the graph of the second relation. The lithography dimension PEB sensitivity is expressed by the amount of change in post-lithography dimensions per a unit degree of the PEB temperature by a unit degree.

The data stored in the first storage section 13 and the data stored in the second storage section 14 are obtained by, for example, conducting experiments in advance. The first storage section 13 and the second storage section 14 are implemented by, for example, hard disks.

The primary correction section 11 obtains post-lithography dimension data from the dimension measuring unit 20 and corrects the set value of a temperature of the heat treatment plate 31 based on the post-lithography dimension PEB sensitivity of the first storage section 13. Specifically, the primary correction section 11 compares actually measured post-lithography dimension data, which is notified from the dimension measuring unit 20, against a predetermined preset value, and corrects the set value of a temperature of the heat treatment plate 31 (e.g., set value of a temperature of a heater) so as to close the gap between the former and the latter. A correction made by the primary correction section 11 is hereinafter referred to as primary correction.

The secondary correction section 12 obtains post-etching dimension data from the dimension measuring unit 20 and corrects the set value of a temperature (preset temperature) of the heat treatment plate 31 based on the post-etching dimension PEB sensitivity of the second storage section 14. The secondary correction section 12 corrects the preset temperature for each of the heat treatment plates. Specifically, actually measured post-etching dimension data, which is notified from the dimension measuring unit 20, is compared against a preset objective value, and the set value of the temperature of the heat treatment plate 31 is corrected so as to close the gap between the former and the latter. A correction made by the secondary correction section 12 is hereinafter referred to as secondary correction.

The actual correction value is varied depending on the type of chemical amplification resist, the temperature characteristics of each PEB plate, and the like. Take as an example a case in which a rise in PEB temperature by 1° C. reduces the post-etching dimensions by 5 nm, in other words, a case in which the slope a of the line (post-etching dimension PEB sensitivity) is −5 nm/° C. In this case, if the post-etching dimensions of a portion that is heated by the heating region 31-1 of FIG. 1 are smaller than the objective value by 20 nm, the preset temperature of the heater in the heating region 31-1 is lowered by 4° C. Lowering the preset temperature by 4° C. increases the post-etching dimensions by 20 nm, thereby giving the pattern the predetermined (objective) dimensions.

Figure 4:
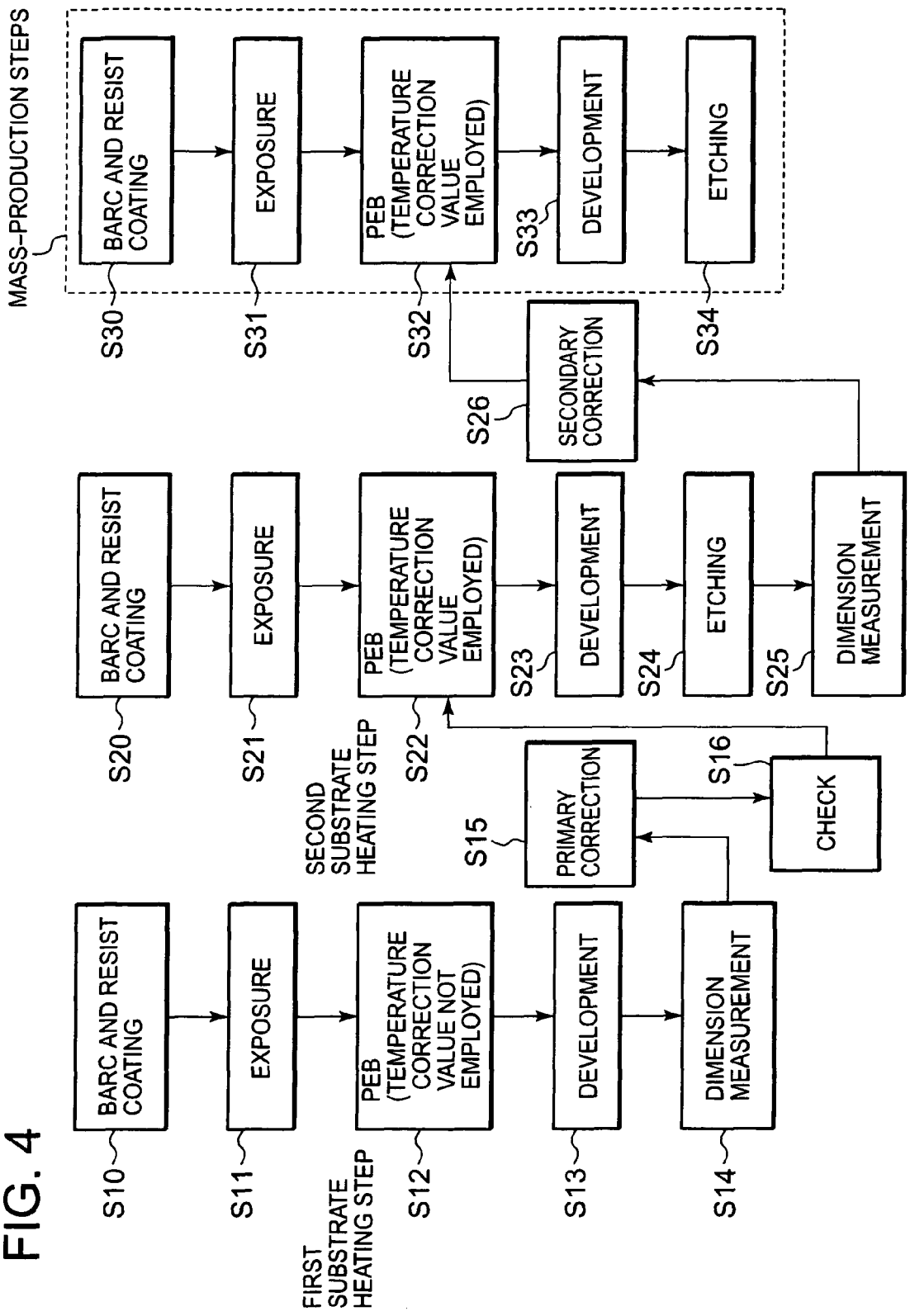
FIG. 4 is a flow chart illustrating a semiconductor device manufacturing method according to the first embodiment of the present invention.

A semiconductor device manufacturing method according to this embodiment is described next. FIG. 4 is a flow chart illustrating the semiconductor device manufacturing method of this embodiment.

Step S10: Resist Coating to First Wafers
(Forming Layer of First Resist)

First, a plurality of first wafers (first chosen wafers) are selected at random from among a plurality of same-type semiconductor wafers that are obtained through the same process steps and have a film being processed formed on their principal surfaces. The number of the first wafers is equal to or larger than the number of the heat treatment plates 31. When there are same-type, same-process semiconductor wafers in many lots, all the wafers in one lot may be selected as first wafers. A layer of chemical amplification resist (first resist) is formed by a resist coater on the film being processed of each of the plurality of prepared first wafers. In some cases, an anti-reflection film called as bottom anti-reflection coating (BARC) is formed prior to the formation of the chemical amplification resist layer. BARC is not described herein, except that, in the case where a BARC is formed, the BARC is etched first in the etching step with the resist pattern as a mask prior to etching of the film, and then the film is etched.

At this stage, the processing of other semiconductor wafers than the first wafers is halted before the resist coating step. This is because letting a semiconductor wafer stand for long immediately before a PEB step, in other words, after an exposure step is undesirable. If resist is not applied to a semiconductor wafer yet, there is no particular limitation to how long the processing of the semiconductor wafer is halted.

Step S11: Exposure

The first wafers are then exposed to light in a predetermined pattern to obtain a plurality of exposed wafers. How the first wafers are exposed is not particularly limited and the method may be dry exposure or immersion exposure. The exposure may employ an exposure unit of any generation. A change in pattern dimensions due to a change with time of an exposure unit, for example, the deposition of a chemical material on a lens of the exposure unit from long-term use, is correctable by controlling the PEB temperature in a manner described below.

Step S12: PEB (First Substrate Heating Step)

The plurality of first wafers are each allocated to one of the plurality of heat treatment plates 31 to receive heat treatment. In the case where all the wafers in one lot are selected as the first wafers, the wafers may be equally distributed among the heat treatment plates 31 for heat treatment. In this step, the wafers are heated at an uncorrected preset temperature. For instance, the wafers are heated by setting a uniform temperature to the plurality of heat treatment plates 31.

Step S13: Development

Next, a developing treatment is performed separately on the plurality of first wafers to form a resist pattern.

Step S14: Post-Lithography Dimension Measurement
(Measuring Resist Pattern Dimensions)

The dimension measuring unit 20 measures the dimension of the developed resist pattern for each of the plurality of first wafers. If the measured dimensions vary significantly, it is recommended to average measurement data by increasing measurement points in number. Measurements provided by the dimension measuring unit 20 are notified as post-lithography dimension data to the control unit 10. The post-lithography dimension data is notified to the control unit 10 in association with the heat treatment plate 31 that has been used in the PEB treatment.

Step S15: Primary Correction

Once the control unit 10 obtains the post-lithography dimension data, the primary correction section 11 performs a primary correction of the preset temperature of the heat treatment unit 30. The primary correction section 11 performs a primary correction for each of the plurality of heat treatment plates 31. Specifically, the obtained post-lithography dimension data is compared against a preset objective value. Based on the post-lithography dimension PEB sensitivity stored in the first storage section 13, the primary correction section 11 then calculates a primary correction value that makes the post-lithography dimensions equal to the objective value. The primary correction section 11 uses the calculated primary correction value to primarily correct the preset temperature of the heat treatment plate 31 that is associated with the obtained data.

One of objectives of the primary correction in this step is to adjust individual differences among the plurality of heat treatment plates 31. It is therefore not always necessary to correct the preset temperature of each of a plurality of heating regions separately with respect to each of the heat treatment plates 31. The primary correction can shorten the adjustment time by correcting the preset temperature of the entire heat treatment plate 31 at a time without adjusting the preset temperature of each individual heating region which is part of one entire heat treatment plate 31. On the other hand, primarily correcting the preset temperature of each of plurality of heating regions separately makes more precise pattern dimension control possible. In the case where the primary correction of the preset temperature is to be performed for each of plurality of heating regions, the post-lithography dimensions of portions that are each heated by one of the plurality of heating regions are measured in Step S14, and the measurements are notified to the control unit 10 in association with their respective heating regions.

Step S16: Checking

After the primary correction of the preset temperature value in Step S15, a plurality of checking wafers (third chosen wafers) are selected for checking from among the wafers the processing of which has been halted before the resist coating step. Resist coating and exposure are performed on the plurality of checking wafers in the same manner. Resist (third resist) and an exposure pattern that are employed in this step are identical with the ones used for the first wafers. Also, the third chosen wafers are exposed by the same method that is employed to expose the first wafers. The plurality of checking wafers are each heated by one of the plurality of heat treatment plates 31 at a preset temperature corrected through the primary correction. The checking wafers are then developed. The dimension measuring unit 20 measures the post-lithography dimensions in order to check whether or not the measured dimensions are closer to the objective value. Specifically, whether or not the gap between the actually measured post-lithography dimensions and the objective value is within a preset range is checked. When the gap is outside the preset range, Step S12 and subsequent steps are repeated until the post-lithography dimensions are within the given range from the objective value. The checking step S16 may be omitted.

The preset temperature of the heat treatment unit 30 is primarily corrected by steps up through Step S16, and a dimension deviation from an objective value due to the lithography step (development step) and preceding steps is thus corrected. In addition, the first wafers and the checking wafers which have been used in steps up through Step S16 can be re-used if the resist is peeled from the wafers.

Step S20: Resist Coating of Second Wafers
(Forming Second Resist)

Next, a plurality of second wafers are selected from among the wafers the processing of which has been halted before the resist coating step. The number of the plurality of second wafers is equal to or larger than the number of the heat treatment plates 31 as in the case for the first wafers. Resist is applied to the plurality of second wafers in the same way as in Step S10. Resist employed in this step (second resist) has the same composition as that of the resist used for the first wafers. The second resist can be the same material as the first resist.

Step S21: Exposure

The plurality of second wafers to which the resist has been applied are exposed to light in a predetermined pattern in the same way as in Step S11. The exposure pattern and the exposure method that are employed in this step are the same as those used for the first wafers.

Step S22: PEB
(Second Substrate Heating Step)

Next, the plurality of second wafers are each heated by one of the plurality of heat treatment plates 31. The preset temperature of the heat treatment plate 31 in this step is a temperature corrected by the primary correction.

Step S23: Development

A developing treatment is performed separately on the plurality of second wafers to form a resist pattern.

Step S24: Etching

With the resist pattern as a mask, the film of the second wafer is etched.

Step S25: Post-Etching Dimension Measurement
(Measuring Dimensions of Etched Pattern)

Thereafter, the dimension measuring unit 20 measures the post-etching dimensions of each second wafer. The measurement of the post-etching dimensions is conducted desirably after the remaining resist mask is peeled off. A plurality of measurement points are set in each second wafer so that the post-etching dimensions of portions of the wafer that are each heated by one of the plurality of heating regions are measured. The dimension measuring unit 20 notifies the control unit 10 of the measurements as post-etching dimension data. The post-etching dimension data is notified to the control unit 10 in association with the heat treatment plate 31 and its heating region that have been used in the PEB treatment.

Step S26: Secondary Correction

Once the control unit 10 obtains the post-etching dimension data, the secondary correction section 12 performs a secondary correction of the preset temperature for each of the plurality of heat treatment plates 31, and for each of the plurality of heating regions. In the secondary correction, the secondary correction section 12 compares the post-etching dimension data against a preset objective value and, based on the post-etching dimension PEB sensitivity, calculates a secondary correction value that makes the post-etching dimensions equal to the objective value. The secondary correction section 12 uses the calculated secondary correction value to secondarily correct the preset temperature of each heating region of each heat treatment plate 31. The secondary correction processing corrects the preset temperature for each of the plurality of heating regions. In other words, the secondary correction section 12 corrects the preset temperature taking into account dimension fluctuations within the wafer plane as well.

Steps S30 to S34: Mass Production

Processing of setting a temperature to the heat treatment unit 30 is completed by the above-mentioned steps up through Step S26. Thereafter, the remaining wafers to which resist has not been applied yet are processed while a PEB treatment is performed at a preset temperature corrected by secondary correction. Semiconductor devices are thus produced in mass.

According to this embodiment, the post-lithography dimensions are measured in Step S14 and, after the primary correction of the preset temperature in Step S15, the post-etching dimensions are measured in Step S25. How much deviation from objective dimensions is caused by the lithography step and preceding steps is known from the post-lithography dimensions measured in Step S14. In addition, the measurement of the post-etching dimensions in Step S25 is executed after a dimension deviation due to the lithography step and preceding steps is corrected by the primary correction in Step S15, and hence the gross amount of dimension deviation which is caused by the etching step is known from the post-etching dimensions measured in Step S25. In short, the degree of dimension deviation due to the lithography step and preceding steps and the degree of dimension deviation due to the etching step are both grasped, which makes it easy to identify the cause of deviation of the ultimately formed pattern from its objective dimensions.

This embodiment also makes it easy to determine whether dimension fluctuations within the wafer plane originate from the lithography step and preceding steps or from the etching step if a preset temperature is set for each of plurality of heating regions separately at the primary correction stage.

Further, the etching treatment is not performed on the first wafers used for the primary correction, and hence the first wafers can be re-used if the resist is peeled from the wafers. Performing the primary correction therefore does not produce wasted substrates.

According to this embodiment, the preset temperature is corrected for each of the plurality of heat treatment plates 31. This prevents the pattern dimensions from varying due to individual differences among the plurality of heat treatment plates 31. In addition, the secondary correction corrects the preset temperature for each heating region, and hence fluctuations in post-etching dimensions within the wafer plane are prevented.

According to this embodiment, the pattern dimensions are controlled by way of the PEB temperature. In this way, the sectional shape of the resist pattern is not affected significantly. This also means that, if the structure of the foundation film and the resist type are the same, there is no need to make a correction for each mask pattern unlike when the pattern dimensions are controlled by correcting exposure conditions.

This embodiment is applied favorably to a step of forming a gate electrode of a MOS transistor in the process of manufacturing a semiconductor device that contains a MOS transistor. To build a MOS transistor, a gate insulating film and a film constituting a gate electrode are formed in order on a surface of a semiconductor wafer where a device isolation film and others have been formed. The film constituting a gate electrode is, for example, a polysilicon film doped with phosphorus or other dopants, or a polycide film obtained by layering a metal silicide film on a polysilicon film. Thereafter, a layer of chemical amplification resist is formed on the wafer surface by a resist coater. The wafer is then exposed to light with the use of a pattern for forming a gate electrode. A PEB treatment and a developing treatment are sequentially performed to form a mask pattern from the resist. With the resist pattern as a mask, the film constituting a gate electrode is selectively etched and the remaining resist is peeled off. A gate electrode is thus formed on the surface of the semiconductor wafer.

The gate electrode dimensions directly influence the characteristics of a MOS transistor. Therefore, applying this embodiment to a step of forming a gate electrode of a MOS transistor makes precise control of the gate electrode dimensions within the wafer plane and accordingly stabilizes the transistor characteristics. When this embodiment is applied to the gate electrode forming step, for example, the gate length, namely, L length, is preferably used as the post-etching dimensions and as the post-lithography dimensions.

This embodiment can be applied to other process steps than a step of forming a gate electrode of a MOS transistor, and is applicable to a device isolation film forming step, a wiring forming step, a via contact hole forming step, and the like.

While this embodiment describes a case in which the film being processed is placed on the principal surface of a semiconductor wafer, the object being processed is not limited to a film formed on a semiconductor wafer. For example, in a device isolation film forming step, a silicon substrate itself which constitutes a semiconductor wafer is etched in some cases, and this embodiment is applicable to this and similar steps. The film being processed in this case corresponds to a portion of the silicon substrate from the surface of the silicon substrate to a depth to which the silicon substrate is etched.

If the preset temperature of each heat treatment plate 31 is updated regularly according to this embodiment, fluctuations in pattern dimensions due to a change with time of the heat treatment plate 31 and a foundation (anti-reflection film) forming process can be reduced.

In the process of manufacturing a semiconductor, a semiconductor wafer is sometimes warped. The extent to which the preset temperature of the heat treatment plate 31 is actually reflected on a resist layer formed on a surface of a semiconductor wafer is varied by the warping of the semiconductor wafer, and the variation may cause the pattern dimensions to deviate from objective dimensions. However, semiconductor wafers of the same type that are obtained through the same process generally tend to be warped in substantially the same fashion. Therefore, by applying this embodiment for each wafer type and each wafer process, the influence of the warping of a semiconductor wafer over a dimension deviation is absorbed.

Second Embodiment

A second embodiment of the present invention will be described next. In this embodiment, after the secondary correction of the preset temperature of the heat treatment unit 30 is performed, whether or not the preset temperature corrected by the secondary correction is appropriate is checked with the use of checking wafers and, in the case where the preset temperature is not appropriate, the preset temperature of the heat treatment unit 30 is set again. The rest of the second embodiment is the same as the first embodiment, and a detailed description thereof will be omitted here.

Figure 5:
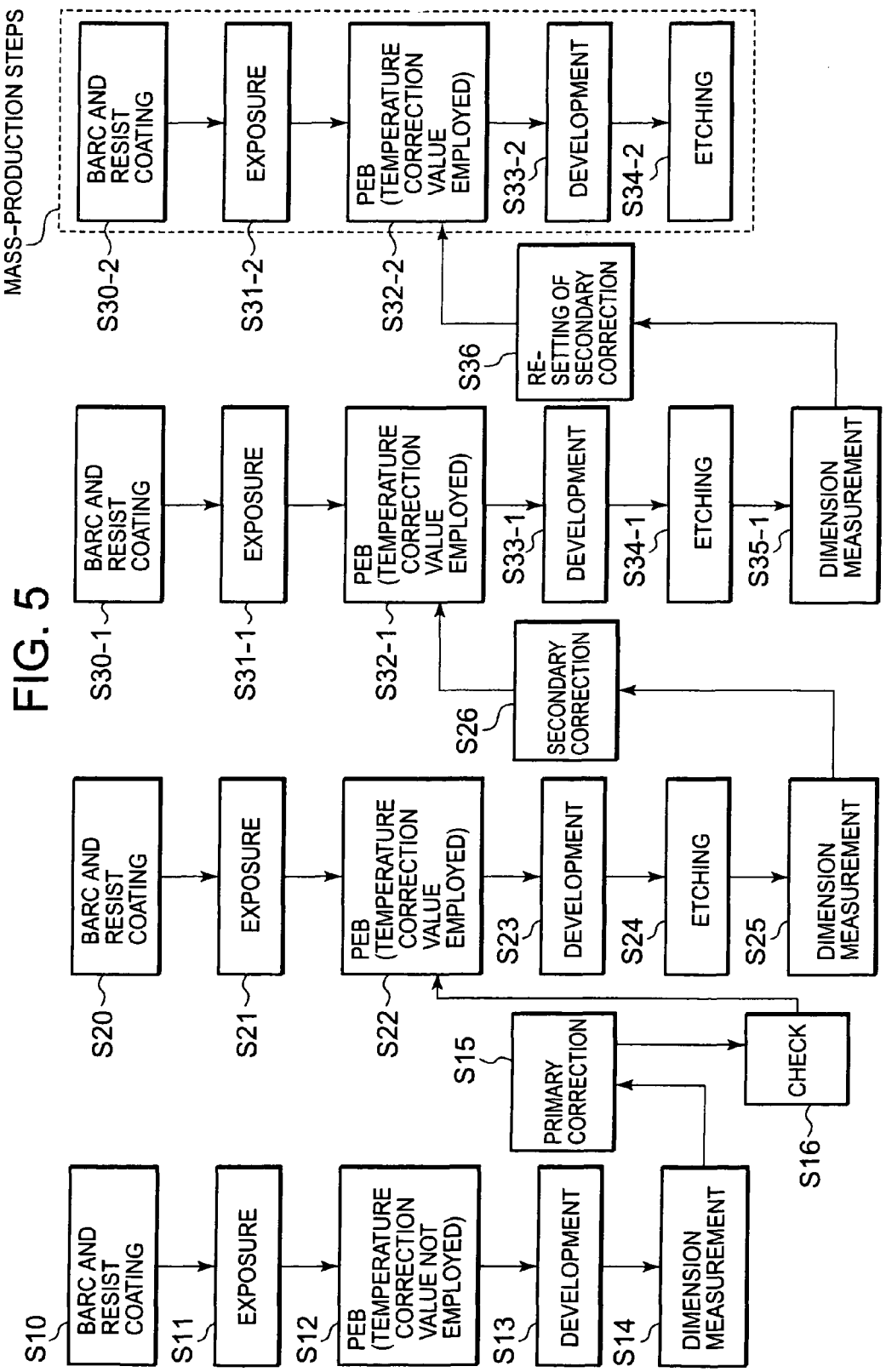
FIG. 5 is a flow chart illustrating a semiconductor device manufacturing method according to a second embodiment of the present invention.

FIG. 5 is a flow chart of a semiconductor device manufacturing method according to this embodiment. In FIG. 5, steps up through Step S26 where the preset temperature of the heat treatment unit 30 is corrected secondarily are the same as those of the first embodiment.

Steps S30-1 to S32-1: Resist Coating to PEB at Secondarily Corrected Temperature of Fourth Wafers After the secondary correction of the preset temperature of the heat treatment unit 30, a plurality of checking wafers (fourth wafers) are selected from among wafers to which resist has not been applied yet. Resist coating and exposure are performed on the plurality of checking wafers. Resist (fourth resist) and an exposure pattern that are employed in this step are identical with the ones used for the first wafers. Also, the fourth wafers are exposed by the same method that is employed to expose the first wafers. The plurality of checking wafers are each heated by the heat treatment unit 30 at a preset temperature corrected by the secondary correction.

Step S33-1: Development

The checking wafers are then developed.

Step S34-1: Etching

Next, an etching treatment is performed on each of the checking wafers.

Step S35-1: Dimension Measurement

The dimension measuring unit 20 measures the post-etching dimensions to check the amount of deviation from objective dimensions and the amount of dimension fluctuation within the same wafer plane. Whether or not the amounts are within preset acceptable ranges is also checked. When the amounts are within the acceptable ranges, semiconductor devices are produced in mass at the preset temperature corrected by the secondary correction. When the amounts are outside the acceptable ranges, it is determined that the preset temperature of the heat treatment unit 30 is not corrected enough and next Step S36 is executed.

Step S36: Re-Setting of Secondary Correction

When it is determined in Step S35-1 that the preset temperature is not corrected enough, measurements measured in Step S35-1 by the dimension measuring unit 20 are input to the control unit 10. The control unit 10 performs the same processing as in Step S26 to calculate a secondary correction value for the second time. The control unit 10 re-sets the preset temperature of each heating region of each heat treatment plate 31 based on the secondary correction value calculated for the second time.

Steps S30-2 to S34-2: Mass Production

Subsequently, semiconductor devices are produced in mass at the preset temperature determined in Step S36.

As described above, according to this embodiment, checking wafers are used to check whether or not a deviation of a formed pattern from an objective value and dimension fluctuations within the wafer plane are close enough to their respective objective values. In the case where the secondary correction is conducted only once, there may be a case where the preset temperature is under-corrected or over-corrected. In this embodiment, on the other hand, the secondary correction is conducted a plurality of times, and the dimension uniformity within the wafer plane is improved more by repeating the secondary correction.

In both the first and second embodiments described above, the processing of some wafers is halted before resist coating while the first wafers to the fourth wafers are processed first, and is resumed after processing results of the first to fourth wafers are obtained. Alternatively, all wafers may finish steps up through the resist coating step. After the resist coating, the processing of the wafers is halted before the exposure step, and the first to fourth wafers are selected in the same manner to receive an exposure treatment and subsequent treatments first. In this case, feedback can be started earlier since the resist coating has been completed. The wafer processing can be suspended between the resist coating step and the exposure step only for a limited period of time, for example, twenty-four hours. Feedback therefore needs to commence in such a manner that allows the remaining wafers to proceed to the exposure step within the acceptable time period.

It is apparent that the present invention is not limited to the above-mentioned embodiments, and the embodiments can be modified and changed as appropriately within the scope of the technical concept of the present invention.

What is claimed is:

1. A semiconductor device manufacturing method comprising:

heating a plurality of first substrates separately by a plurality of heat treatment plates, said plurality of first substrates each having on its surface a layer of first resist which is formed by exposure in a predetermined pattern;

performing a primary correction of a preset temperature for each of the plurality of heat treatment plates after said heating said plurality of first substrates;

heating a plurality of second substrates separately by said plurality of heat treatment plates at said preset temperature corrected by said primary correction, said plurality of second substrates each having a layer of second resist which is formed by exposure in said predetermined pattern on a surface of a layer of resist having the same composition as a composition of said first resist; and performing a secondary correction of a preset temperature for each of said plurality of heat treatment plates after said heating said plurality of second substrate, wherein said primary correction is executed based on measured dimensions of a pattern of said first resist which is obtained by developing each of said plurality of first substrates after said heating said plurality of first substrates, and wherein said secondary correction is executed based on measured dimensions of an etching pattern which is obtained by developing and etching each of said plurality of second substrates after said heating said plurality of second substrates.

2. A semiconductor device manufacturing method comprising:

forming a layer of first resist on a principal surface of each of a plurality of first substrates;

exposing each of said plurality of first substrates to light in a predetermined pattern after said forming said layer of first resist;

heating said plurality of first substrates separately by a plurality of heat treatment plates, after said exposing each of said plurality of first substrates;

developing said each layer of first resist after said heating said plurality of first substrates;

measuring resist pattern dimensions of said each layer of first resist after developing said each layer of first resist;

performing a primary correction of a preset temperature for each of said plurality of heat treatment plates based on said measured resist pattern dimensions of said each layer of first resist;

forming a layer of second resist having the same composition as that of said first resist on a principal surface of each of a plurality of second substrates;

exposing each of said plurality of second substrates to light in the predetermined pattern after forming said layer of second resist;

heating said plurality of second substrates separately by said plurality of heat treatment plates at said preset temperature corrected by said primary correction after said exposing each of said plurality of second substrates;

developing said each layer of second resist after said heating said plurality of second substrates;

etching each of said plurality of second substrates after said developing said each layer of second resist;

measuring dimensions of an etched pattern that is formed on said principle surface of each of said plurality of second substrates after said etching each of said plurality of second substrates; and performing a secondary correction of the preset temperature for each of said plurality of heat treatment plates based on said measured dimensions of said etched pattern.

3. The semiconductor device manufacturing method according to claim 2, wherein each of said plurality of heat treatment plates have has a plurality of heating regions controlled in temperature independently of one another, wherein said measuring dimensions of said etched pattern comprises measuring pattern dimensions in places that correspond respectively to said plurality of heating regions for each of said plurality of second substrates, and wherein said performing said secondary correction comprises performing said secondary correction of the preset temperature for each of said plurality of heating regions of each of said plurality of heat treatment plates.

4. The semiconductor device manufacturing method according to claim 2, further comprising:

peeling said second resist remaining on said principle surface of each of said plurality of second substrates between said etching each of said plurality of second substrates and said measuring dimensions of said etched pattern.

5. The semiconductor device manufacturing method according to claim 2, further comprising:

checking the preset temperature corrected by said primary correction after said performing said primary correction, wherein said checking the preset temperature corrected by said primary correction comprises:

forming a layer of third resist having the same composition as that of said first resist on a principal surface of each of a plurality of third substrates;

exposing each of said plurality of third substrates to light in said predetermined pattern after said forming the layer of said third resist;

heating said plurality of third substrates separately by said plurality of heat treatment plates at said preset temperature corrected by said primary correction after said exposing each of said plurality of third substrates;

developing each of said plurality of third substrates after said heating said plurality of third substrates separately;

measuring pattern dimensions formed on said principal surface of each of said plurality of third substrates after said developing each of said plurality of third substrates; and re-setting said preset temperature corrected by said primary correction for each of said plurality of heat treatment plates, based on said measured pattern dimension formed on said principal surface of each of said plurality of third substrates.

6. The semiconductor device manufacturing method according to claim 2, further comprising:

checking said preset temperature corrected by said secondary correction after said performing said secondary correction, wherein said checking said preset temperature corrected by said secondary correction comprises:

forming a layer of fourth resist having the same composition as that of said first resist on a principal surface of each of a plurality of fourth substrates;

exposing each of said plurality of fourth substrates to light in said predetermined pattern after said forming the layer of said fourth resist;

heating said plurality of fourth substrates separately by said plurality of heat treatment plates at said preset temperature corrected by said secondary correction after said exposing each of said plurality of fourth substrates to light;

developing each layer of said fourth resist on the principal surface of each of said plurality of fourth substrates after said heating said plurality of fourth substrates separately;

etching each of said plurality of fourth substrates after said developing each layer of said fourth resist;

measuring dimensions of an etched pattern formed on the principal surface of each of said plurality of fourth substrates after said etching each of said plurality of fourth substrates; and re-setting said preset temperature corrected by said secondary correction for each of said plurality of heat treatment plates based on said measured pattern dimension formed on the principal surface of each of said plurality of fourth substrates.

7. The semiconductor device manufacturing method according to claim 6, further comprising:

peeling off said fourth resist remaining on the principle surface of each of said plurality of fourth substrates between said etching each of said plurality of fourth substrates and said measuring the dimensions of said etched pattern formed on the principle surface of each of said plurality of fourth substrates.

8. A computer readable medium storing a program executed by a computer for operating a semiconductor device manufacturing equipment, wherein said semiconductor device manufacturing equipment comprises:

a plurality of heat treatment plates for performing a post-exposure bake (PEB);

a first storage section for storing a first relation, said first relation being an association relation between post-development resist pattern dimensions and a preset temperature during said PEB;

a second storage section for storing a second relation, said second relation being an association relation between post-etching pattern dimensions and the preset temperature during said PEB;

a primary correction section for obtaining post-development resist pattern dimension data for each of a plurality of first substrates processed separately by said plurality of heat treatment plates, and for primarily correcting the preset temperature for each of said plurality of heat treatment plates based on said first relation; and a secondary correction section for obtaining post-etching pattern dimension data for each of a plurality of second substrates processed separately by said plurality of heat treatment plates at the preset temperature corrected by said primary correction, and for secondarily correcting the preset temperature for each of said plurality of heat treatment plates based on said second relation, wherein said program comprises:

primarily correcting the preset temperature for each of said plurality of heat treatment plates based on post-development resist pattern dimension data for each of a plurality of first substrates processed separately by said plurality of heat treatment plates and said first relation stored in said first storage section; and secondarily correcting the preset temperature for each of said plurality of heat treatment plates based on post-etching pattern dimension data for each of a plurality of second substrates processed separately by said plurality of heat treatment plates at the preset temperature corrected by said primary correction said second relation stored in said second storage section.

* * * * *